(12) United States Patent
Ullakko

(10) Patent No.: US 6,747,377 B2
(45) Date of Patent: Jun. 8, 2004

(54) METHOD FOR PRODUCING MOTION AND FORCE BY CONTROLLING THE TWIN STRUCTURE ORIENTATION OF A MATERIAL AND ITS USES

(76) Inventor: Kari M. Ullakko, Pihlajatie 3C, Espoo (FI), FIN-02270

( * ) Notice: Subject to any disclaimer, the term of this patent is extended or adjusted under 35 U.S.C. 154(b) by 0 days.

(21) Appl. No.: 10/126,748

(22) Filed: Apr. 19, 2002

(65) Prior Publication Data

US 2002/0117906 A1 Aug. 29, 2002

Related U.S. Application Data

(60) Continuation of application No. 09/692,626, filed on Oct. 19, 2000, now abandoned, which is a division of application No. 08/983,057, filed on Jan. 12, 1998, now Pat. No. 6,157,101.

(51) Int. Cl.[7] .................. H01L 41/20; H01L 41/26; H01F 1/47
(52) U.S. Cl. ........................................ 310/26
(58) Field of Search .............................. 310/326

(56) References Cited

U.S. PATENT DOCUMENTS 5,958,154 A * 9/1999 O'Handley et al. ......... 148/312
6,157,101 A * 12/2000 Ullakko ...................... 310/26

FOREIGN PATENT DOCUMENTS

WO    WO 97/03472    * 1/1997    ........... H01L/41/00
WO    WO 98/08261    * 2/1998    ........... H01L/41/00

OTHER PUBLICATIONS

MSM Mechanism, Adapta, Adapta Materials Technology, pp. 1–2, Dec. 2002.*
The SMA model, SMA Simiulation, pp. 1–5, Jan. 2003.*
MURI Description, Hybrid active FSMA/polymer micro–composites and electrostrictors: Engineering FSMA–base actuators for Navy applications, pp. 1–5, Jan. 2003.*
The effect of field cooling and field orientation on the martensitic phase transformation in a $Ni_2MnGa$ single crystal, by S–Y. Chu et al., Journal of Applied Physics, vol. 87, No. 9, May 2000.*
K. Ullakko, "Journal of Materials Engineering and Performance," vol. 5, No. 3, pp. 405–409, Jun. 1996.

* cited by examiner

Primary Examiner—Thomas M. Dougherty
(74) Attorney, Agent, or Firm—Skinner and Associates

(57) ABSTRACT

The present invention refers to a method for obtaining shape changes, motion and/or force in a material having a twinned structure. According to the method, a sufficiently high external magnetic field applied to the material reorients the twin structure thereby producing motion/force. The operation is possible if the magnetocrystalline anisotropy energy is higher than or comparable to the energy of the reorientation of the twin structure to produce a certain strain.

17 Claims, 4 Drawing Sheets

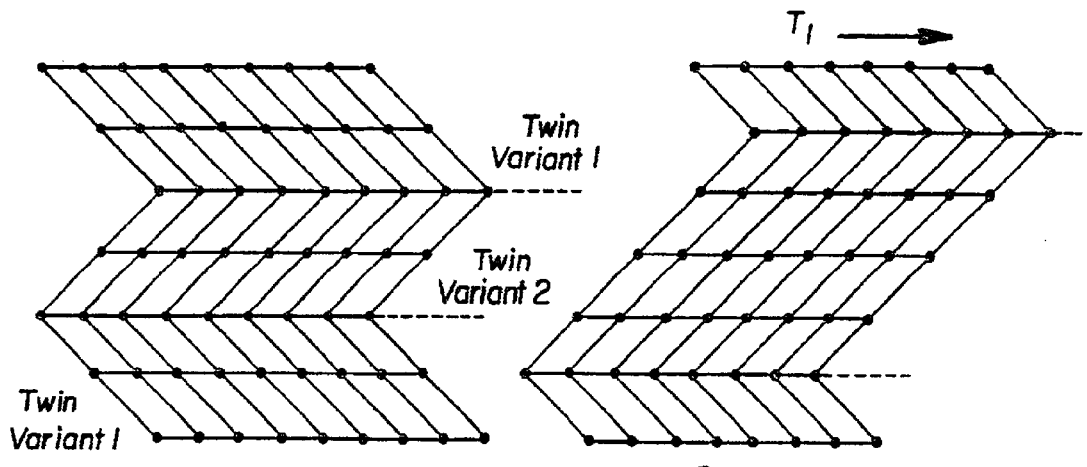
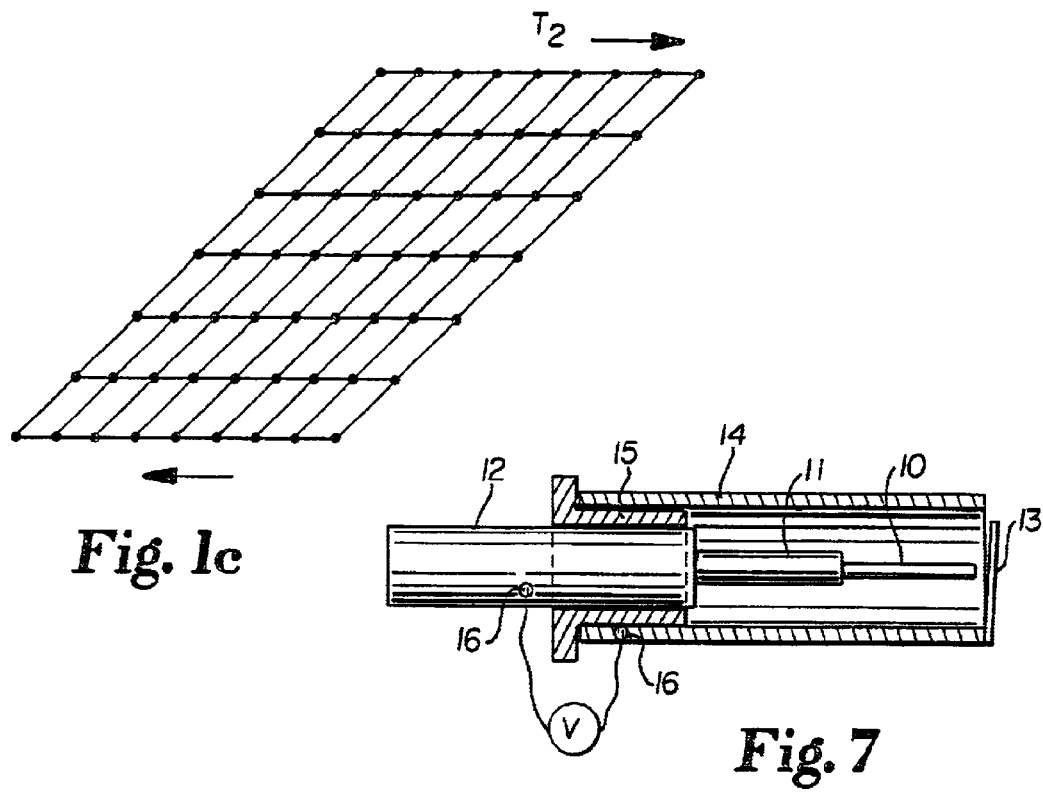
Fig. 1a  Fig. 1b
Fig. 1c  Fig. 7

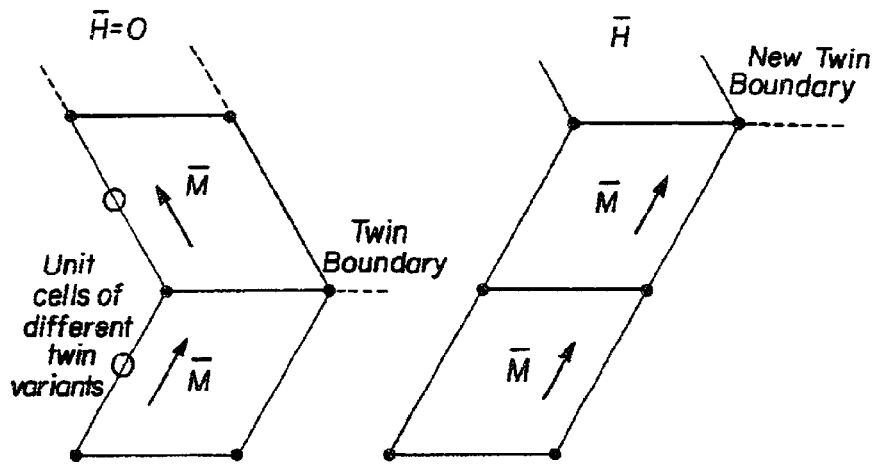
*Fig. 4a*   *Fig. 4b*
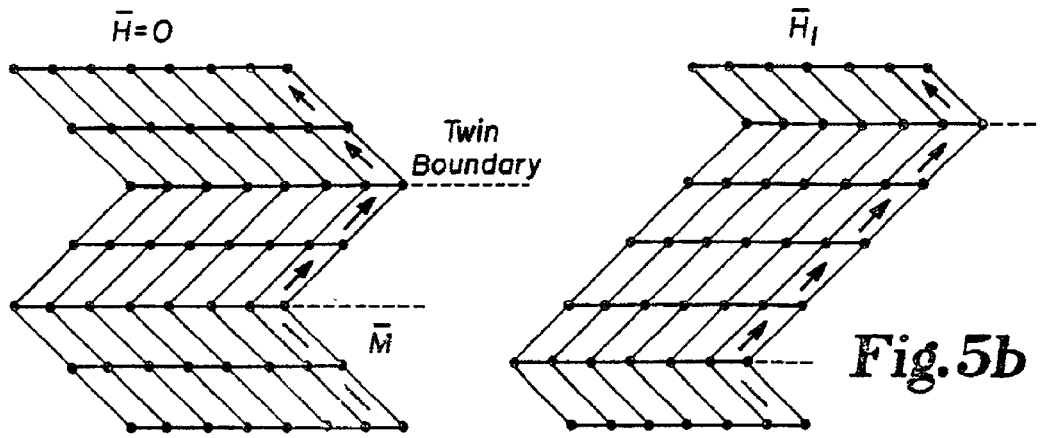
*Fig. 5a*   *Fig. 5b*
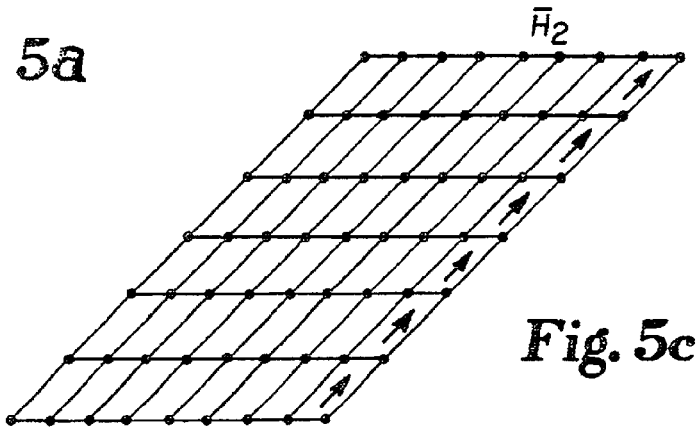
*Fig. 5c*

METHOD FOR PRODUCING MOTION AND FORCE BY CONTROLLING THE TWIN STRUCTURE ORIENTATION OF A MATERIAL AND ITS USES

This application is a continuation of application Ser. No. 09/692,626, filed Oct. 19, 2000 now abandoned, which is a divisional of application Ser. No. 08/983,057, filed Jan. 12, 1998 now U.S. Pat. No. 6,157,101, which claims the foreign priority benefits under Title 35, U.S.C. §119(a)–(d) or §365(b) of any foreign application(s) for patent or inventor's certificate, or §365(a) of any PCT International application which designated at least one country other than the United States of America, of Finland Application No.: 953394, filed Nov. 17, 1995 and PCT Application No.: PCT/FI96/00410, filed Nov. 7, 1996, which are hereby incorporated by reference.

FIELD OF THE INVENTION

The present invention relates to a method for controlling the twin orientation by the magnetic field in a material having such a structure. The aim is to produce shape changes, motion and force by using actuators based on this method.

BACKGROUND OF THE INVENTION

Control of motion and force is one of the basic elements in mechanical engineering. Development of new materials has made it possible to produce motion and force using special functional materials called actuator materials. The most important groups of actuator materials available are piezoelectric ceramics, magnetostrictive intermetallics, and shape memory alloys. Piezoelectric ceramics develop strains when subjected to an electric field. Frequency response of these materials is fast, but the strain amplitudes are very small, which limits their applicability. Magnetostrictive materials are strained when a magnetic field is imposed on them. Certain high-magnetostrictive intermetallics (e.g., Terfenol-D, Etrema Products, Inc., Ames, Iowa, USA) offer strains up to 0.17%, which is an order of magnitude higher than those of the current piezolectrics. The frequency response of the magnetostrictive intermetallics is lower than that of the piezoelectrics.

Shape memory metals are materials which, when plastically deformed at one temperature, can recover their original undeformed state upon raising their temperature above an alloy-specific transformation temperature. In these materials, crystal structure undergoes a phase transformation into, and out of, a martensite phase when subjected to mechanical loads or temperature. The process when a mechanically deformed shape memory material returns to its original form after heating is called a one-way shape memory effect. Cooling the material subsequently will not reverse the shape change. The one-way shape memory effect is utilized in fastening, tightening and prestressing devices. Strains of several percent can be completely recovered, and recovery stresses of over 900 MPa have been attained. In the case of the two-way effect, no deformation is required, and the material "remembers" two configurations that are obtained by heating and cooling to alloy-specific temperatures. The temperature difference between the two configurations can be as small as 1 to 2 K Materials that exhibit a two-way shape memory effect are used to develop forces and displacements in actuators. Those actuators are applied in machinery, robotics and biomedical engineering. The most extensively used shape memory materials are Ni—Ti and Cu-based alloys. A drawback of the shape memory actuators is their slow response due to the thermal control (especially in cooling) and low efficiency (energy conversion), which in many alloys is only about one percent.

In order for the shape memory effect to occur, the material must exhibit a twinned substructure. The shape change of the shape memory material is based on the reorientation of the twin structure in the external stress field. A two-dimensional illustration of the Win reorientation is presented in FIG. 1. FIG. 1(a) shows two twin variants, denoted by 1 and 2, with equal proportions in the absence of the external stress. When the stress is applied, FIG. 1(b), the twin boundaries move and variant 2 grows at the expense of variant 1, producing the shape which better accommodates the applied stress. The result of moving a twin boundary is thus to convert one twin variant into another. The variants which are most favorably oriented to the applied stress will grow. Ultimately, a single variant of martensite can be produced by straining a sufficient amount, as illustrated in FIG. 1(c). In the martensite phase, the variants are usually oriented in several crystallographic directions. Therefore, complex shape changes of the material can be produced by the reorientation of the twin structure, and a full shape recovery will be obtained. Crystallographic analysis has shown that the boundaries between the martensite plates also behave as twin boundaries, i.e., the individual plates of martensite themselves are twins with respect to adjoining plates. Thus the term "twin boundaries", generally refers to the boundaries between martensite plates as well as the boundaries between the boundaries within the plates (this definition also concerns the magnetically controlled twin boundaries discussed below). In some materials, applied stress induces formation of the martensite phase whose twinned substructure is preferentially oriented according to the applied stress.

Reorientation of the twin structure is responsible for the recoverable strains of several percent in appropriate materials (e.g., close to 10 percent in Ni—Ti shape memory alloys). In some alloys the stress required to reorient the twin structure is very low. FIG. 2 shows the stress-strain curves for the selected shape memory materials. It is seen that strains of 4 percent are attained by stresses of 20 to 50 MPa in most of those alloys. Stresses as low as 1 to 30 MPa result in strains of one percent. Strain energy densities needed to produce the strain of 1 percent by the reorientation of the twin variants are the areas restricted by the stress-strain curves, strain axis and the vertical dashed line in FIG. 2. The strain energy densities for the alloys In—Tl, Ni—Mn—Ga (ferromagnetic $Ni_2MnGa$), CuZn—Sn and Cu—Zn are $10^4$, $8.5 \times 10^4$, $1.1 \times 10^5$ and $2.3 \times 10^5$ $J/m^3$, respectively.

In the following, magnetic anisotropy energy is introduced, because it plays an important role in the present invention. In ferromagnetic crystals magnetocrystalline anisotropy energy is an energy which directs the magnetization along certain definite crystallographic axes called directions of easy magnetization. FIG. 3 shows the magnetization culves of single crystalline cobalt which has a hexagonal crystal structure. Its easy direction of magnetization is the parallel axis of the unit cell. The saturation is reached at a low magnetic field value in this direction, as shown in FIG. 3. Saturating the sample in the basal plane is much more difficult. A magnetic field over 8000 Oe is needed for saturation. The basal plane direction is called a hard direction of magnetization. Magnetic anisotropy energy density corresponding to the magnetization processes in different directions is the area between the magnetization curves for those directions. In cobalt the energy density needed to saturate the sample in the hard direction is about $5 \times 10^5$ J/m$^3$ (the area between the saturation curves in FIG. 3). Anisotropy energy densities of magnetically hard Fe- and Co-based alloys range from $10^5$ up to $10^7$ J/m$^3$. The highest anisotropy energy densities (K1 values), close to $10^8$ J/m$^3$, are in 4f metals at low temperatures. In intermetallic compounds such as Co$_5$Nd, Fe$_{14}$Nd$_2$B and Sm$_2$Co$_{17}$ the anisotropy energy densities at room temperature are $1.5 \times 10^7$, $5 \times 10^7$ and $3.2 \times 10^6$ J/m$^3$, respectively.

SUMMARY OF THE INVENTION

This invention concerns an operational principle of the magnetically driven actuators that produce motion and force. The operation is based on the magnetic-field controlled reorientation of the twin structure of the actuator material. These kinds of actuators can produce strains of several percent (as large as the shape memory materials produce). Because of the magnetic control of the new actuators, the response times are much faster, control more precise, and efficiency better than those of the shape memory materials. The new magnetically driven actuators will exhibit a great potential in mechanical engineering. They will replace hydraulic, pneumatic and electromagnetic drives in many applications. Employment of these actuators leads to simpler, lighter, and more reliable constructions than use of conventional technology. Because the twin reorientation occurs in three dimensions, complex shape changes can be produced under the magnetic control. Applicability of this invention is expanded by the possibility for controlling and supplying the power of the actuators at a distance. The whole machine developing a controlled motion or desired shape changes (e.g., bending, twisting, clipping, fastening, pumping fluids) may be a small appropriately shaped and preoriented piece of material. Due to the small twin size in many materials, this invention is expected to have great potential also in micro- and nanotechnology.

BRIEF DESCRIPTION OF THE DRAWINGS

FIGS. 1(a) to 1(c) show a schematic (two dimensional) presentation of the shape change in martensite material as described above, namely turning of the twin variants by stress.

FIG. 4 shows the principle of the present invention, namely turning of the twin variants by the external magnetic field.

FIG. 4(a) presents the starting situation in the absence of the external magnetic field;

FIG. 4(b) shows the turning of the twin variant by the applied magnetic field H.

FIGS. 5(a) to 5(c) show the principle of the magnetic-field-induced shape change of the twinned material which results in the shape change of the material and the motion and force of the actuator, namely;

FIG. 5(a) presents the starting situation in the absence of the external magnetic field;

FIG. 5(b) shows the step where the external magnetic field H$_1$ acts on the material;

FIG. 5(c) presents the ultimate situation after the complete reorientation of the twin structure by the magnetic field.

FIG. 7 illustrates an actuator based on the method of the present invention.

DETAILED DESCRIPTION OF THE INVENTION

Figure 2:
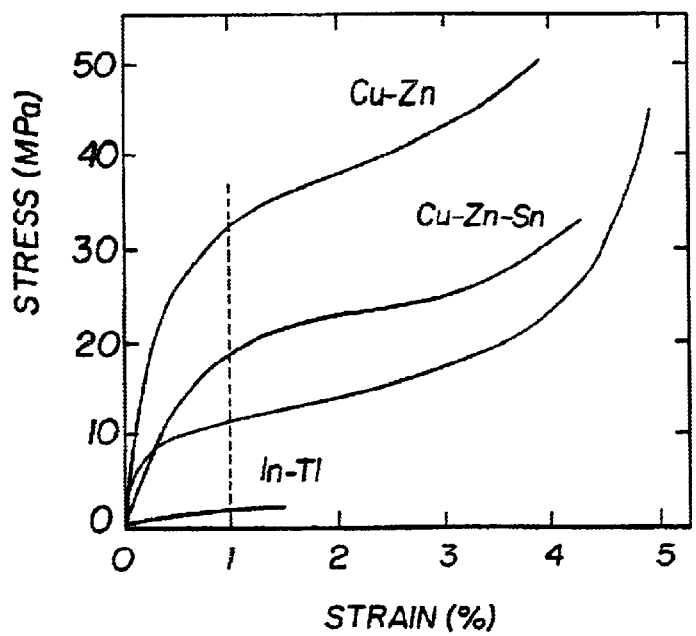
FIG. 2 shows stress-strain (tensile) curves for single crystalline alloys In—Tl, Cu—Zn—Sn and a Ni—Mn—Ga Heusler-alloy (Ni$_2$MnGa) and for a polycrystalline Cu—Zn shape memory alloy during the reorientation of the twin structure.
Figure 3:
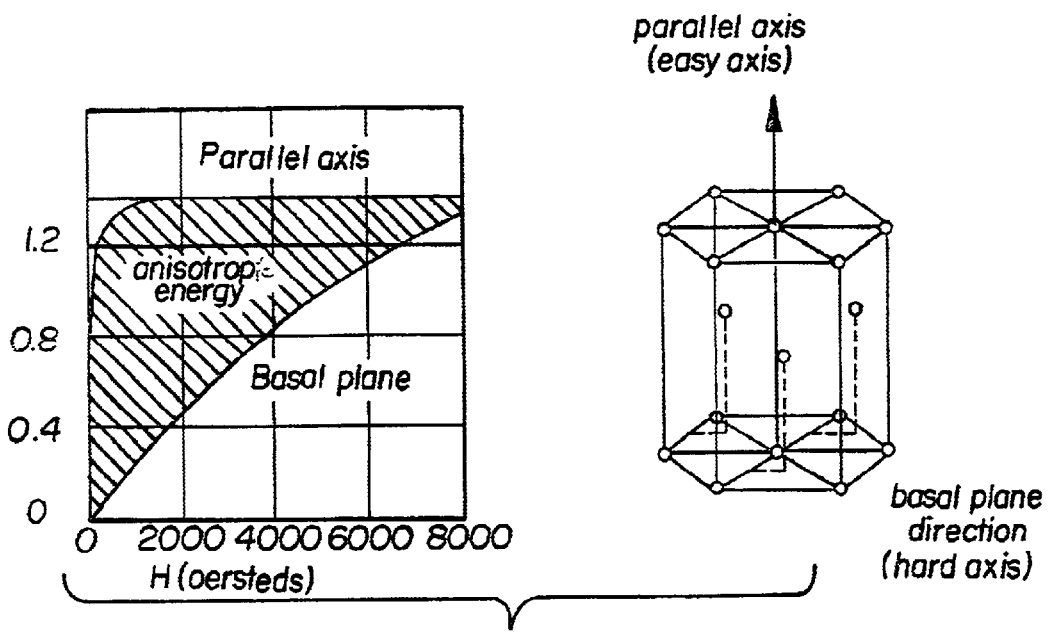
FIG. 3 presents magnetization curves of single crystalline cobalt.

This invention is a new method for producing shape changes, motion and/or force in materials, based on the reorientation of the twin structure under the application of the external magnetic field.

The present invention is described on the following pages by explaining the relevant properties of the present invention and by referring to some figures describing the background for easier understanding of the present invention. Reference is made to all FIGS. 2 to 6.

FIG. 4 shows a two-dimensional illustration of the principle of the reorientation of the twin structure by the applied magnetic field. In crystalline ferromagnetic materials, magnetization vectors lie along directions of easy magnetization in the absence of the external magnetic field. This situation is shown in FIG. 4(a) for two twin variants. The easy direction of magnetization is parallel with the side of the unit cells of each variant. It is emphasized that the easy direction is not necessarily parallel with the side of the unit cell but it can also be any other crystallographic direction characteristic of the material.

When an external magnetic field is applied on a crystalline ferromagnetic material, the magnetization vectors tend to turn from the easy direction of the unit cell to the direction of the external magnetic field. If the magnetocrystalline anisotropy energy, denoted by U$_k$ in this presentation, is high, the magnetic field strengths required to turn the magnetization off from the easy directions are also high. This was illustrated for hexagonal cobalt in FIG. 3. If the energy of turning the twin variants, (i.e., the energy of the motion of the twin boundaries) is low enough compared to the magnetocrystalline anisotropy energy U$_k$, the twin variants are turned by the external magnetic field, and the magnetization remains in the original easy direction of the turned unit cells. FIG. 4b shows how the unit cells of one variant are turned into another by the external magnetic field. As a result, twins in favorable orientation to the magnetic field grow at the expense of the other twins, as shown in FIG. 5.

FIG. 5(a) represents the starting situation in the absence of the field when the twin variants with equal proportions are present. Magnetization is aligned parallel to one side of the unit cell in each variant In the figure, only a part of the magnetization vectors is shown. in this illustration twins are assumed to be consisted of only single ferromagnetic domains (recent TEM studies have revealed that twins in some ferromagnetic martensites e.g Fe—Pt can be consisted of two magnetic domains whose domain wall crosses the twin.)

FIG. 5(b) shows how the unit cells whose easy direction of magnetization are different from the direction of the external magnetic field are turned so as to line up with the field direction. This results in the growth of the favorably oriented twin variant and the decrease of the other variant. Ultimately, only one twin variant may remain, as shown in FIG. 5(c).

The reorientation of the twin structure described above results in the shape change of the material, which can produce motion and force in the magnetically controlled actuators made from this material. It is possible also to produce complex shape changes because the reorientation of the twin structure occurs in three dimensions. The original dimensions of the actuator material may be restored by eliminating the field, or by turning the field to another direction. Effects of the external magnetic field on the orientation of the martensite unit cells can cause the directed motion of martensite-martensite and austenite-martensite interfaces, which may also be utilized in actuators. In that case the preferentially oriented twinned martensite grows at the expense of the parent phase. This growth can also be reversible.

The magnetic-field-control of the reorientation of the twin variants is expected to produce recoverable strains of several percent in appropriate materials (analogous to stress-induced recoverable strains in the shape memory alloys). To reach a certain magnetically induced strain, it is necessary that the magnetocrystalline anisotropy energy $U_k$ of the material is larger than or comparable to the energy needed to reorient the twin variants to achieve this strain. The latter energy, defined as the energy of the reorientation of the twin structure, and denoted by $E_{tw}$ includes also strain and dissipation energy terms related to the shape change of the material. In the actuator applications, $U_k$ must be greater than the sum of $E_{tw}$, and the work of the actuator. The work term may be positive or negative. If the work is negative, the external stress may assist the reorientation of the twin structure and decrease the magnetic field energy required. For the actuator to be able to operate, it is necessary that the magnetic field energy that controls the actuator must be larger than the sum of $E_{tw}$, and the work of the actuator. The higher the $U_k$ is, the larger the magnetic field energies are which can be converted to mechanical work of the actuators and, hence, the higher forces are attained.

In the following, the magnitudes of the anisotropy energies will be compared with the energies of the reorientation $E_{tw}$ in different materials. As it was shown in FIG. 2, energy densities $E_{tw}$ for producing strain of 1 percent in the selected martensitic shape memory alloys are between $10^4$ and $2.3 \times 10^5$ J/m$^3$. On the other hand, there is a diversity of materials available in which magnetic anisotropy energy densities are $10^5$ to $10^8$ J/m$^3$. Some examples (Co-, Fe- and rare-earth-based alloys) were given above. Anisotropy energy densities of some materials are even four orders of magnitude larger than the energy densities $E_{tw}$ for the reorientation of the twin structure, e.g., in In—Tl. This large difference in energies $U_k$ and $E_{tw}$, reveals that there is a great potential for finding optimal materials that combine high anisotropy energy and low $E_{tw}$.

In some ferromagnetic martensites twin boundaries are highly mobile under application of stress. It was shown in FIG. 2 for the ferromagnetic martensitic Ni$_2$MnGa (single crystalline) that stresses as low as 10 to 20 MPa in direction [100] cause the reorientation of the twin variants, resulting in the recoverable strains of 4 percent To reach a strain of 1 percent in this alloy by the magnetic-field induced reorientation of the twin structure, anisotropy energy must be larger than the energy of the reorientation of the twin variants $E_{tw}$, $8.5 \times 10^4$ J/m$^3$, according to FIG. 2. This value is quite low and, therefore, the magnetically induced strains are expected to be possible in this material. In most ferromagnetic shape memory alloys available to date and other iron-based alloys that exhibit a twinned substructure, stresses for aligning the twins are higher, even above 100 MPa. However, their magnetocrystalline anisotropy energies are often high enough for producing magnetic-field-induced strains based the reorientation of the twin structure, which has been experimentally demonstrated in some alloys. For example, in a material in which the stress of 100 MPa would be needed to reorient the twin structure producing a strain of 1 percent, $E_{tw}$ is calculated to be $5 \times 10^5$ J/m$^3$ (assuming that stress increases linearly with strain). In order to produce the same strain by the magnetic-field-induced reorientation of the twin structure, anisotropy energy must be larger than or equal to $5 \times 10^5$ J/m$^3$. This anisotropy energy value is the same as that of cobalt and is attainable in many Fe- and Co-based alloys.

As a third example, let us assume that a very high stress of 500 MPa would be needed to produce a strain of 1 percent by the reorientation of the twin structure in some materials. To produce the strain of the same amount by the magnetic field, anisotropy energy density of $2.5 \times 10^6$ J/m$^3$ is needed. This anisotropy energy value is attainable in suitable alloys, because the highest anisotropy energies at room temperature are even 20 times larger. It is emphasized that only estimations obtained from some material classes are used in this presentation for evaluating the magnetocrystalline anisotropy energies, because the anisotropy energy values for the twinned materials with low $E_{tw}$ cannot be measured using saturation magnetization measurements (see FIG. 3). The reason is that the magnetization does not turn in the applied field to the hard direction of the unit cells, but the saturation is reached by turning the twin variants (together with the magnetization vectors) at lower magnetic field levels. The magnetization measurements should be made on single variant samples which are in many cases not possible to produce.

The development is focused in finding new ferromagnetic materials which exhibit high anisotropy energy and low $E_{tw}$. The best materials may combine high anisotropy energies coming from the rare earth metals and highly glissile twin boundaries of a suitable twinned phase. Also Co- and Fe-based shape memory materials in which the martensitic lattice is close-packed hexagonal or cubic are promising and are being developed. The role of the interstitial atoms, especially nitrogen may be important, because they often increase the anisotropy energy and strengthen the alloy mechanically, which favors twinning as a deformation mechanism and prevents permanent slip. One interesting group of the magnetically controlled actuator materials are Heusler alloys (e.g., Ni$_2$MnGa-type) in which Mn is responsible for their ferromagnetic properties.

The velocity of the twin boundaries is very fast in many materials, even a fraction of the speed of sound. This means that the magnetic-field-induced strokes are very fast in suitable actuator materials, and the actuators can operate at high frequencies.

EXAMPLES

The reorientation of the twin structure by the magnetic field was experimentally studied in Fe—Ni—Co—Ti, Fe—Ni—C and Fe—Mn—N -based alloys. These materials are ferromagnetic and exhibit a twinned microstructure. The anisotropy energies were measured to be typically about $5 \times 10^5$ J/m$^3$ for Fe—Ni—Co—Ti alloys and $2 \times 10^5$ J/m$^3$ for Fe—Ni—C alloys. These are expected to be sufficiently high for producing the magnetic-field-induced strains based on the reorientation of the twin structure. The experimental setup employed in the present studies and examples of the measurements are shown in the following.

The Experimental Setup

Figure 6:
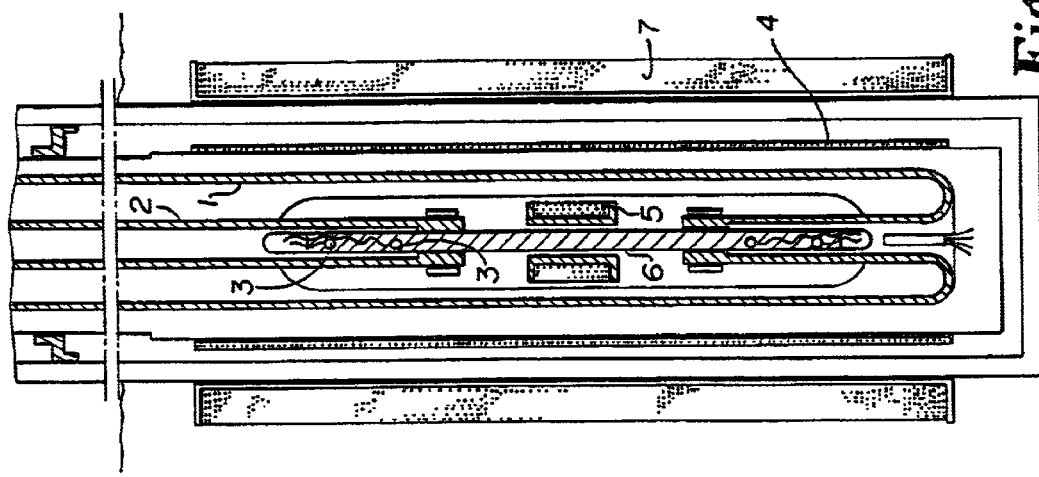
FIG. 6 shows the experimental setup for studying the reorientation of the twin structure by the magnetic field.

The principle of the equipment for studying the effects of stress and magnetic field on the twin structure is shown in FIG. 6. This equipment makes it possible to apply axial and torsional stresses on the sample, and to measure the corresponding strains. The sample 6 was fixed in two coaxial supporting tubes 1 and 2. Tube 1 was fixed and tube 2 was used for straining the sample. The sample chamber was surrounded by a coil 7 for applying the magnetic field to the sample. In alternating magnetic field, a frequency response of the magnetically induced strains was measured at low frequencies. At higher frequencies, the frequency response was measured using a strain gauge attached on the sample. In these measurements bar 2 was removed. This arrangement was also used in experiments made on bent samples. the strain gauges were placed on both sides of the bent sample. The changes of strains caused by the applied magnetic field were measured in static and alternating magnetic fields.

Arrangements for measuring electrical resistivity and magnetic susceptibility were also made on the sample holder, as shown in FIG. 6, namely the four point contacts 3 for resistivity and the coils 5 for susceptibility measurements. The sample chamber was immersed in liquid nitrogen or liquid helium, and the temperature could be controlled between 4 and 600 K using a heater 4.

Dissipation attributed to the motion of the twin boundaries and the martensite interfaces was also studied with this equipment. The amount of martensite was detected using electrical resistivity and magnetic susceptibility measurements. Also Mössbauer spectroscopy was used to determine the phase fraction of martensite. Mössbauer spectroscopy was more suitable for the present studies than X-ray spectrocopy, because Mössbauer measurements are not sensitive to the texture of the sample.

Example 1

An alternating twisting deformation was applied to the sample, and the vibration damping capacity was measured. These experiments revealed that twin boundaries (as well as the interfaces between austenite and the twinned martensite) were highly mobile. The measurements were made at strain amplitudes $10^{-6}$–$10^{-3}$.

Example 2

Magnetically induced strains were measured on the bent samples. In the beginning, the martensitic sample was bent mechanically. During this deformation one side of the sample was elongated and the other side was contracted. As a result, the twin structures on different sides of the samples were oriented in different ways, leading to the different proportions of twin variants, to accommodate compressive and tensile stresses. It was confirmed that the amount of martensite was the same on both sides of the sample. When the magnetic field was applied to the bent sample, the field-induced strains appeared, and they were in opposite directions on different sides of the sample. On the side which was initially elongated by the mechanical stress, the magnetic field induced a contraction and on the other side the field induced an elongation. For example, when a magnetic field of 1 kOe was applied on a slightly bent twinned martensitic Fe—Ni—C sample of 1 mm in thickness, the difference in strains between the two sides was $2.2\times10^{-5}$. This value is higher than magnetostriction of this material. Magnetostriction cannot be the explanation for this effect, because it cannot cause strains of the opposite directions in different sides of the sample, and secondly because its magnitude is too small.

The initial mechanical deformation was also made by twisting. The twisting deformation results in a specific reorientation of the twin structure. When the magnetic field was applied on this structure, the torsional strains appeared.

The magnetically induced strains observed on the bent and twisted samples could be attributed to the reorientation of the twin structure or the growth of the preferentially oriented martensite, The present experiments were made, however, above $M_d$ temperatures of the martensite. At temperatures above $M_d$, the formation of martensite is not thermodynamically possible, which confirmes that the magnetically controlled reorientation of the twin structure causes the strains observed.

The bending and twisting experiments also suggest that more complicated shape changes can be produced using external magnetic field.

Example 3

X-ray diffraction patterns of martensite were measured in magnetic fields perpendicular to and parallel to the surface of the sample. The intensities of the individual Bragg peaks correlate with the fraction of the twin variants in the diffraction condition. The measurements showed changes in peak intensities which were attributed to the magnetically induced twin reorientation of the martensite. The peak intensities were observed to change also in alloys in which only the inner parts of martensite plates are twinned. The outer parts of the plates consist of dislocation cells and tangles. Therefore, the interfaces between the martensite and austenite phases are immobile in those alloys, and the magnetic-field-controlled growth of the martensite plates with preferentially oriented twin variants cannot serve as an explanation for the effects observed.

Industial Applicability

The new actuators based on the present invention exhibit a great technological and commercial potential. No other method for producing motion and force based on the material properties can develop such a combination of high strains, forces, speed and precision as these new actuators. Potential applications are fuel injectors, high-pressure pumps, actuators of active vibration control, active springs, valve lifters and controllers, robots, precision tooling and linear motors. Actuators can also be integrated with sensing and control capabilities. Those systems, named adaptive, active or smart structures, are becoming general in modem machine design. Sensing the operational parameters of a machine in real time, and responding to the environmental or internal changes in a controlled manner makes it possible to attain more optimal operation, minimal energy consumption, enhanced lifetimes of the structures and lower maintenance costs. Adaptive structures are applied in aerospace, automotive, marine and civil engineering, precision machining and production engineering. The most widely used actuators are pneumatic and hydraulic systems, electromagnetic drives and actuator materials such as piezoelectrics, magnetostrictive intermetallics and shape memory alloys. Progress of the adaptive structures has been severely retarded by the absence of the high speed and large stroke actuator materials. The new materials based on the present invention may lead to a great advance in the technology of the adaptive structures and modern engineering.

Because the reorientation of the twin structure occurs in three dimensions, complex shape changes including tension, bending and twisting of the samples can be produced by the magnetic field. This significantly expands the applicability of the present invention in many fields of engineering and machinery. Other magnetically driven actuators based on magnetostriction do not have such properties. The actuator/machine developing a controlled motion or certain shape changes by the magnetic field may be an appropriately shaped and preoriented piece of material. By designing the shape and the initial twin structure properly, the actuator can repeat complex shape changes when the intensity of the magnetic field is cycled. The trace of the motion of the actuator can be changed by changing the direction of the field.

The method of the present invention makes it possible to control the operation of the actuators remotely. Remote control is suitable, for example, in biomedical applications like in medical instruments, artificial organs, such as a heart. A large number of actuators could operate simultaneously using a common magnetic-field-control. Even if the magnetic field were the same for all of the actuators, the actuators could be made to operate in different ways depending on the initial twin structure made in the material.

Because the twin structure is expected to be controlled also in thin films, wires and particles, the actuators based on this invention may also be applied in micro and nanotechnology. The actuators could be even the size of the individual twins. The nanoactuators could utilize, e.g., quantum tunneling currents for the position sensing.

The present invention is a new method for producing motion, force and shape changes using electric energy. Actuators based on this method may exhibit a potential to become the most widely used electric drives after motors and other devices based on electromagnetic forces. In several fields of engineering, the new actuators are expected to replace the conventional electric devices due to their better performance, greater reliability and lower costs. The largest potential of the present invention may lie, however, in new applications which only the technology based on this invention makes possible.

The following are examples of actuators based on the method of turning the twin orientation of the actuator material.

Example 1

An actuator that produces contraction in the direction of an applied magnetic field is shown in FIG. 7. The basic construction of this actuator is similar to that actuator used for testing the actuator materials (FIG. 6) and includes an actuator material component 10, a moving part of micrometer 11, a micrometer 12, and end plate of actuator 13, a body of actuator 14, an insulator 15 and electric contacts 16. All other parts except the insulator 15 are conducting. The actuator material component was placed an the micrometer. When the micrometer is turned, the actuator material component touches the other end of the actuator closing the electric circuit that is consisted of the micrometer actuator material component and the body of the actuator. When a single crystalline Ni$_2$MnGa material was used as an actuator component, the electric circuit opened when applying a magnetic field in the direction of the actuator component. Keeping the magnetic field unchanged and turning the micrometer until the electric circuit was closed again, the magnetic-filed-induced contraction of the actuator material was measured. The results showed that the actuator material component contracted about 0.06% in the applied magnetic field that was about 0.5 T. This strain is significantly larger than magnetostriction of that material. This experiment demonstrates the operational principle of an electric relay based on the actuator materials whose shape changes based on reorienting the twin structure of the material by the external magnetic field. The relay was also tested using an alternating magnetic field. The contacting was monitored by an oscilloscope. The relay could open and close the electric circuit at a frequency that is much higher value than obtained with conventional magnetomechanical relays.

Evaluating the stiffness of this material with the strain of 0.06% and the frequency of 1 kHz, power output density of the actuator material component used in the relay, is about 1 kg/kW (electric motor exhibits an output power density of few hundred W/kg). This technology makes it possible to make fast and powerful relays. The precise motion control of the relays makes it possible to contact alternating currents at a moment when the voltage is zero. This is important in high volage circuit breakers. The potential new materials according to the invention will make the amplitudes of the actuator material component much larger.

The same basic construction as shown in FIG. 7 for an electric contactor can also be used to regulate a flow of liquid or gas in valves and injectors. The actuator material component can move, e.g., a cone that restricts and closes the flow. The fast response and (several kHz) and large displacements that are potentially even a few per cent of the diminsion of the actuator material make such valves and injectors suitable for many applications. They can also bi feed-back controlled, that is important, for instance, in fuel injectors of engines. It is possible to detect burning temperature and pressure and compositions of exhaust gases and control the fuel injection in real time to obtain an optimal burning process and poeration of the engine.

Example 2

A. Linear Motor

Figure 8:
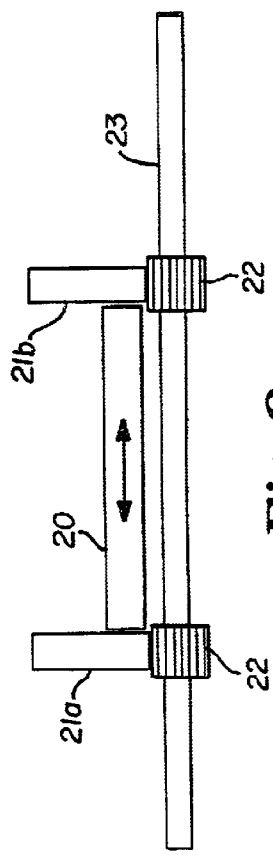
FIG. 8 illustrates another actuator.

A piece of 100 mm of the actuator material used in the previous example 1 produces a back-and-forth motion of about 100 mm/s at a frequency of 1 kHz. Magnetic-field-induced strains of several per cent at frequencies of a few kHz of the expected new materials according to invention will result in a speed of several meters/second. In linear motors the back-and-forth motion of the actuators is directed in one direction using specific electromechanical arrangements. Typically those solutions are consisted of using three actuators, one of which is the main actuator responsible for the motion of the linear motor and two auxiliary actuators that clamp by turns in the rear and front ends of the main actuator synchronously to the frequency of the main actuator, FIG. 8 shows an example of such a linear motor including main actuator 20, auxiliary actuator 21, clamp 22, and guide bar 23.

B. Linear Motor-Traveling Occurs in a Tube

A linear motor actuator produces motion and force under the application of a magnetic field based on the shape changes of the actuator material component using the method of the present invention. The actuator is composed of the actuator material component and a magnet (usually electromagnet) that produces the controlling (driving) magnetic field, and optionally also the bias magnet with magnetic flux paths connecting it to the actuator component and the mechanical loading system for mechanical biasing. The actuator is composed of the actuator material component in which the reorientation of the twin structure is obtained by the internal magnetic field of the material that is induced by ordering the magnetic structure by cooling the material below its Curie temperature or by external mechanical stress or by electric current passing through the actuator material component.

Linear motion is composed of successive steps produced by a motion of a main actuator by two auxiliary actuators are fixed at both ends of the main actuator. The auxiliary actuators clamp by turns on a guide, along which the main actuator travels, synchronous to the back and forth motion of the main actuator. One step of the linear motion on a guide is generated, when the auxiliary actuator in one end is clamped (and the auxiliary actuator in the other end is not clamped) during, e.g., the extension phase of the main actuator, and the auxiliary actuator of the other end is clamped during the reverse motion of the main actuator. The auxiliary actuators clamp on inside a tube, the whole linear motor being inside the tube.

C. Linear Motor

Figure 9:
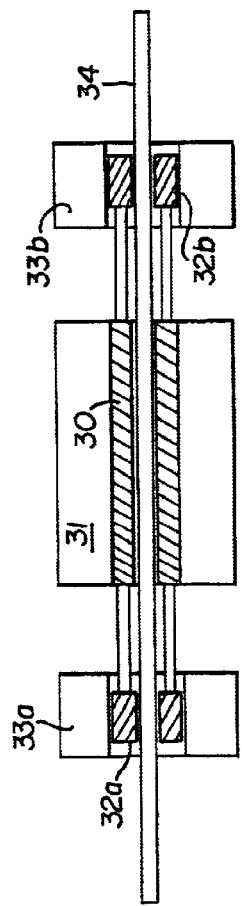
FIG. 9 illustrates another actuator.

A further linear motor embodiment is shown in FIG. 9 including actuator material component 30 of main actuator, electromagnet 31 for driving component 30, auxiliary actuator material component 32 clamping on guide 34 along which actuator's linear motor travels, and coil 33 driving auxiliary actuator material 32.

Example 3

Figure 10:
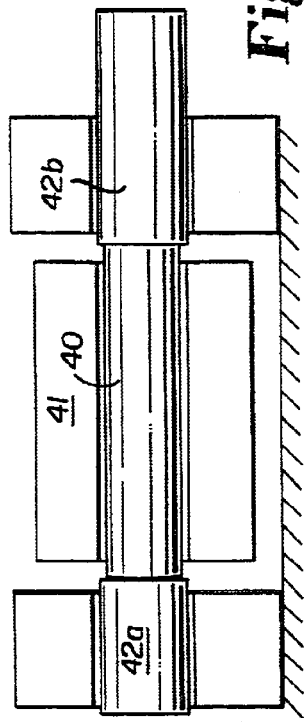
FIG. 10 illustrates another actuator.

Referring to FIG. 10, a motor is shown wherein the rotational motion is generated by successive steps produced by twisting of one part of the axis of the motor controlled by magnetic field. The motor includes actuator material component 40 of main actuator which is deformed by twisting in applied field, electromagnet 41 driving component 40, and actuator material 42 which expands radially. The twisting part of the axis being an actuator named a main actuator. Two auxiliary actuators are fixed at both ends of the main actuator, The auxiliary actuators clamp by turns on the axis, synchronous to the back and forth angular motion of the main actuator. One step of the rotational motion of the axis is generated, when the auxiliary actuator in one end of the axis is clamped (and the auxiliary actuator in the other end of the axis is not clamped) during the step of the angular motion of the main actuator in one direction, and the auxiliary actuator of the other end is clamped during the reverse motion of the main actuator.

The speed of the angular motion is controlled by the frequency or amplitude of the main actuator, and the direction of the angular motion is reversed by reversing the phase of the clamping of the auxiliary actuators. The driving coil of the main actuator is placed radially around the axis of the motor. The auxiliary actuators clamp on the cylindrical or polygonal (number of faces corresponding to the twisting angle of the main actuator) bars fixed radially at both ends of the twisting component of the main actuator. The cylindrical or polygonal bars are expanded axially in a magnetic field directed along with the axis of the motor. The back and forth twisting motion of the main actuator occurs at a mechanical resonance of the angular vibration modes of the actuator material component of the main actuator. The motion of the auxiliary actuators occurs at a mechanical resonance of those actuators. The impedances of the electromagnets driving the main and auxiliary actuators are selected in such a way that those electromagnets operate in an electromagnetic resonance at the same frequency as the mechanical resonance of the main and auxiliary actuators drive the motor. The electromagnets driving the main and auxiliary actuators are digitally controlled in such a way that the timing of the clamping is optimized to obtain maximal precision, speed and force of the motion of the motor.

The methods of the present invention can be used with respect to actuators, linear motors and/or motors in applications, including, but not limited to:

1. in robots and manipulators to produce fast and precise motion that can be actively controlled using information obtained from sensors.
2. in aircraft to control the flaps of the wings and other objects in which hydraulic control is used presently.
3. in weapon systems to orient/turn/direct weapons and control systems by producing fast and precise motion that can be actively controlled using information obtained from sensors.
4. in elevators and lifters.
5. to generate mechanical vibrations, e.g., sound, in solid, liquid and gaseous intermedia.
6. to produce countervibrations in constructions and machines to actively control vibrations and noise.
7. to produce angular countervibrations to actively control the angular vibrations of the axes and other rotating parts of the machines.
8. to conduct electric currents.
9. to regulate a flow of a liquid or a gas in valves.
10. in pumps.
11. to produce motion of the injector needle to regulate the flow of gas or liquid, especially fuel in engines.
12. to produce motion in valve lifters of engines.
13. in active suspension of equipment and vehicles.
14. to produce electric current when the actuator material is deformed by an external force. Voltage generating the current is induced in the coil surrounding the actuator material due to the change of the direction of magnetization caused by the reorientation of the twins that accommodate the shape change of the actuator material during the deformation.
15. in constructions in which actuators are placed.
16. to generate electric power from mechanical vibrations.
17. to absorb vibration energy, by leading the electric current though a shunt resistor.

The descriptions above and the accompanying drawings should be interpreted in the illustrative and not the limited sense. While the invention has been disclosed in connection with the preferred embodiment or embodiments thereof, it should be understood that there may be other embodiments which fall within the scope of the invention as defined by the following claims. Where a claim is expressed as a means or step for performing a specified function it is intended that such claim be construed to cover the corresponding structure, material, or acts described in the specification and equivalents thereof, including both structural equivalents and equivalent structures.

What is claimed is:

1. A method for controlling the orientation of the twin structure in a material having a twinned structure, comprising applying to the material a magnetic field which is of a direction and of a magnitude enough for reorienting the twin structure of the material, to produce thereby shape changes of the material and motion and/or force, wherein an actuator is produced for use in surgical instruments or artificial organs.

2. An actuator material component made from a metallic or ceramic ferromagnetic material whose shape changes are controlled by applying to the material a magnetic field which is of a direction and of a magnitude enough for reorienting the twin structure of the material, to produce thereby shape changes of the material and motion and/or force, thus producing motion and force in the actuator.

3. An actuator, wherein the shape changes of the component made from a metallic or ceramic material are controlled by a magnetic field which is of a direction and of a magnitude enough for reorienting the twin structure of the material, thus producing motion and force.

4. A component of ferromagnetic or ferrimagnetic material, whose shape changes are controlled by applying to the material a magnetic field which is of a direction and of a magnitude enough for reorienting the twin structure of the material, wherein the shape change of the material under the application of the magnetic field is extension or contraction in the direction of the field.

5. An actuator that produces motion and force under the application of a magnetic field based on the shape changes of an actuator material component using the method of applying to the material a magnetic field which is of a direction and of a magnitude enough for reorienting the twin structure of the material, to produce thereby shape changes of the material and motion and/or force.

6. The actuator according to claim 5, wherein the actuator is composed of an actuator material component and a magnet that produces a controlling magnetic field.

7. The actuator according to claim 5, wherein the actuator is composed of the actuator material component in which the reorientation of the twin structure is obtained by the internal magnetic field of the material that is induced by ordering the magnetic structure by cooling the material below its Curie temperature or by external mechanical stress or by electric current passing through the actuator material component.

8. A component of ferromagnetic or ferrimagnetic material, whose shape changes are controlled by applying to the material a magnetic field which is of a direction and of a magnitude enough for reorienting the twin structure of the material, wherein the shape change of the material under the application of the magnetic field is extension or contraction in a direction other than the direction of the magnetic field.

9. A component of ferromagnetic or ferrimagnetic material, whose shape changes are controlled by applying to the material a magnetic field which is of a direction and of a magnitude enough for reorienting the twin structure of the material, wherein the shape change of the material under the application of the magnetic field is bending in the application of the magnetic field.

10. A component of ferromagnetic or ferrimagnetic material, whose shape changes are controlled by applying to the material a magnetic field which is of a direction and of a magnitude enough for reorienting the twin structure of the material, wherein the shape change of the material under the application of the magnetic field is twisting, the rotation axis being in the direction of the magnetic field.

11. A component of ferromagnetic or ferrimagnetic material, whose shape changes are controlled by applying to the material a magnetic field which is of a direction and of a magnitude enough for reorienting the twin structure of the material, wherein the shape change of the material under the application of the magnetic field is twisting, the rotation axis being other than the direction of the magnetic field.

12. A component of ferromagnetic or ferrimagnetic material, whose shape changes are controlled by applying to the material a magnetic field which is of a direction and of a magnitude enough for reorienting the twin structure of the material, wherein the shape change of the material under the application of the magnetic field is a combination of extension, contraction, bending, or twisting.

13. A component of ferromagnetic or ferrimagnetic material, whose shape changes are controlled by applying to the material a magnetic field which is of a direction and of a magnitude enough for reorienting the twin structure of the material, wherein the material in which the shape change under the application of the magnetic field of one part of the material is any of extension, contraction, bending, and/or twisting, and in another part of the material the shape change is another combination of extension, contraction, bending or twisting.

14. A component of ferromagnetic or ferrimagnetic material, whose shape changes are controlled by applying to the material a magnetic field which is of a direction and of a magnitude enough for reorienting the twin structure of the material, wherein the microstructure of the material is deformed at predetermined temperatures and magnetic fields and cycling the application of the magnetic field to produce desired shape changes of the material.

15. A component of ferromagnetic or ferrimagnetic material, whose shape changes are controlled by applying to the material a magnetic field which is of a direction and of a magnitude enough for reorienting the twin structure of the material, wherein the material is placed in a matrix made from another material, thus forming a composite structure.

16. A component of ferromagnetic or ferrimagnetic material, whose shape changes are controlled by applying to the material a magnetic field which is of a direction and of a magnitude enough for reorienting the twin structure of the material, wherein the material is biased by a static magnetic field to obtain shape changes in the applied driving magnetic field.

17. A component of ferromagnetic or ferrimagnetic material, whose shape changes are controlled by applying to the material a magnetic field which is of a direction and of a magnitude enough for reorienting the twin structure of the material, wherein the material is biased by mechanical stress to affect the oriented twin structure of the material to produce a desired shape change of the material in the magnetic field.

* * * * *